(12) United States Patent
Ishimoto

(10) Patent No.: US 6,366,102 B1
(45) Date of Patent: *Apr. 2, 2002

(54) WAFER PROBING MACHINE

(75) Inventor: Takashi Ishimoto, Mitaka (JP)

(73) Assignee: Tokyo Seimitsu Co., Ltd., Mitaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/076,109

(22) Filed: May 12, 1998

(30) Foreign Application Priority Data

May 14, 1997 (JP) .............................. 9-124336

(51) Int. Cl.$^7$ .............................................. G01R 31/02
(52) U.S. Cl. ...................................... 324/754; 324/758
(58) Field of Search ................................ 324/754, 750, 324/755, 758, 765, 158.1, 73.1; 34/58, 312; 369/34, 36, 39

(56) References Cited

U.S. PATENT DOCUMENTS

| | | | | |
|---|---|---|---|---|
| 4,103,232 A | * | 7/1978 | Sugita et al. ................ 324/765 |
| 4,695,707 A | * | 9/1987 | Young ...................... 324/158.1 |
| 4,901,011 A | * | 2/1990 | Koike et al. ................. 324/757 |
| 5,086,270 A | * | 2/1992 | Karasawa et al. ........... 324/754 |
| 5,254,939 A | * | 10/1993 | Anderson et al. ........... 324/754 |
| 5,479,108 A | * | 12/1995 | Cheng ........................ 324/765 |
| 5,481,512 A | * | 1/1996 | Morioka et al. ............... 369/36 |
| 5,604,443 A | * | 2/1997 | Kitamura et al. ........... 324/754 |
| 5,640,100 A | * | 6/1997 | Yamagata et al. ........... 324/754 |
| 5,678,320 A | * | 10/1997 | Thompson et al. ............. 34/58 |
| 5,798,651 A | * | 8/1998 | Aruga et al. ................. 324/754 |
| 5,968,282 A | * | 10/1999 | Yamasaka ...................... 134/6 |

* cited by examiner

Primary Examiner—Safet Metjahic
Assistant Examiner—Minh N. Tang
(74) Attorney, Agent, or Firm—Nixon Peabody LLP; David S. Safran

(57) ABSTRACT

An inspection tray on which an inspection wafer is placed is detachably mounted on a special tray on which a cleaning wafer is placed. The special tray can be horizontally drawn out from a body of a wafer probing machine. Thus, it is possible to easily confirm types of cleaning wafer and inspection wafer.

7 Claims, 4 Drawing Sheets

F I G. 1
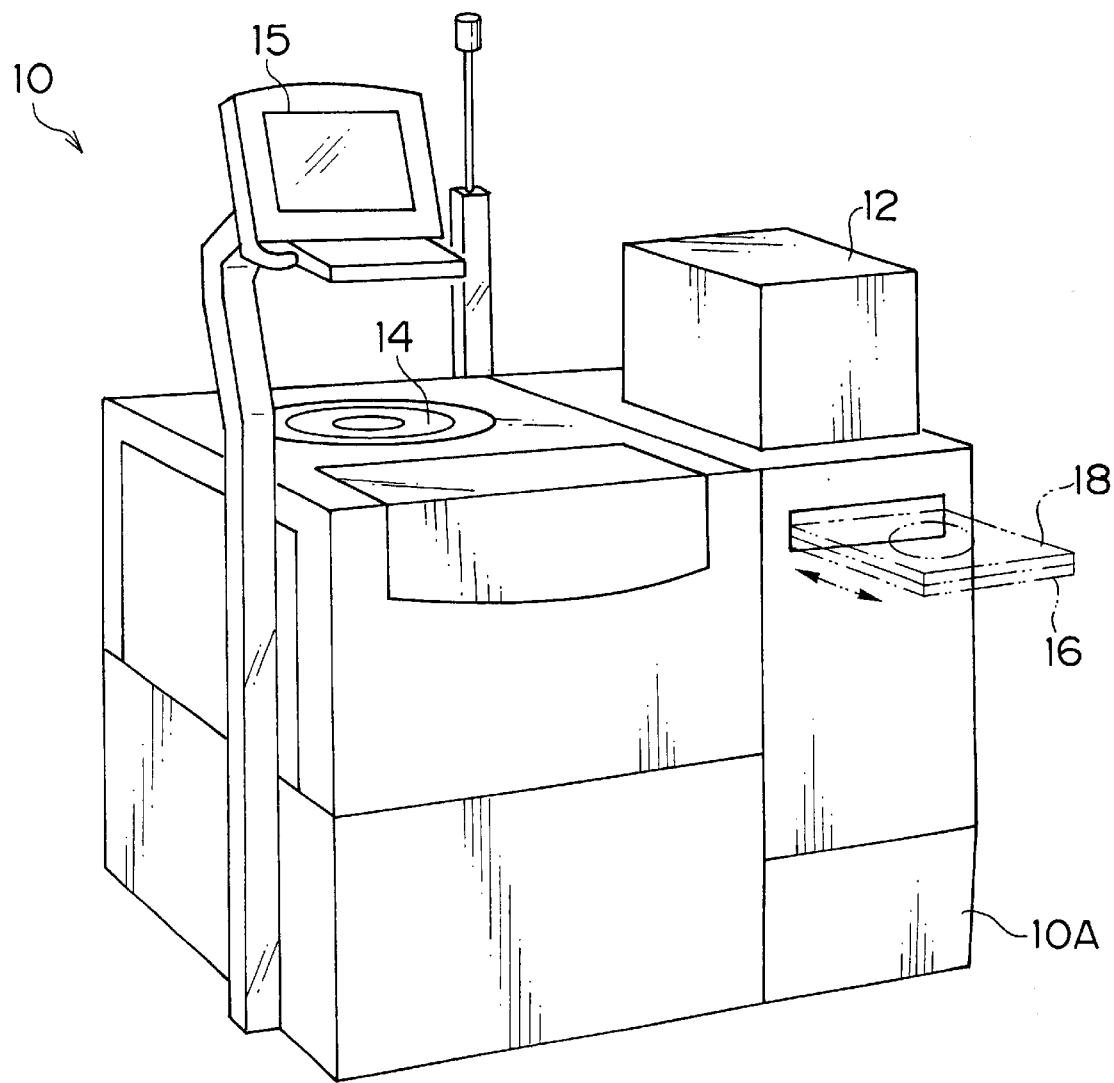

WAFER PROBING MACHINE

BACKGROUND OF THE INVENTION

1. Field of the Invention

The present invention relates generally to a wafer probing machine, and more particularly to a wafer probing machine that measures and tests electric characteristics of integrated circuits formed on a semiconductor wafer.

2. Description of Related Art

The wafer probing machine has a wafer cassette containing wafers subject for probe, an inspection tray on which a wafer for inspection is placed, and a special tray on which a cleaning wafer for cleaning probe needles is placed.

In a conventional wafer probing machine, only the inspection tray can be drawn out from the body of the machine, whereas the special tray cannot be drawn out since it is fixed in the body of the machine. Hence, in order to find what type of cleaning wafer is currently placed on the special tray, the operator must pick up the cleaning wafer from the special tray by means of a transport arm that is provided in the body of the machine.

It takes a long period of time and is very inconvenient to pick up the cleaning wafer by means of the transport arm. Moreover, since the transport arm is also used for transporting the wafers between the cassette and a probe part, the machine must be suspended when the cleaning wafer is picked up while the machine is working, and thus, the throughput is decreased.

SUMMARY OF THE INVENTION

The present invention has been developed in view of the above-described circumstances, and has as its object the provision of a wafer probing machine that makes it possible for an operator to easily confirm types of wafer placed on a wafer tray.

To achieve the above-mentioned object, a wafer probing machine of the present invention is characterized in that a plurality of wafer trays are stacked in a body of the wafer probing machine and are capable of being drawn out from the body.

According to the present invention, the operator can easily confirm types of wafer that is placed on the wafer tray by drawing out the stacked wafer trays from the body of the probing machine even while the machine is working. Since at least one of the wafer trays is detachable from the other wafer trays, the wafer that is placed on the detachable wafer tray can be easily transported to another place.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIG. 1 is a perspective view illustrating a general construction of an embodiment of the wafer probing machine according to the present invention;

DETAILED DESCRIPTION OF THE PREFERRED EMBODIMENT

Figure 2:
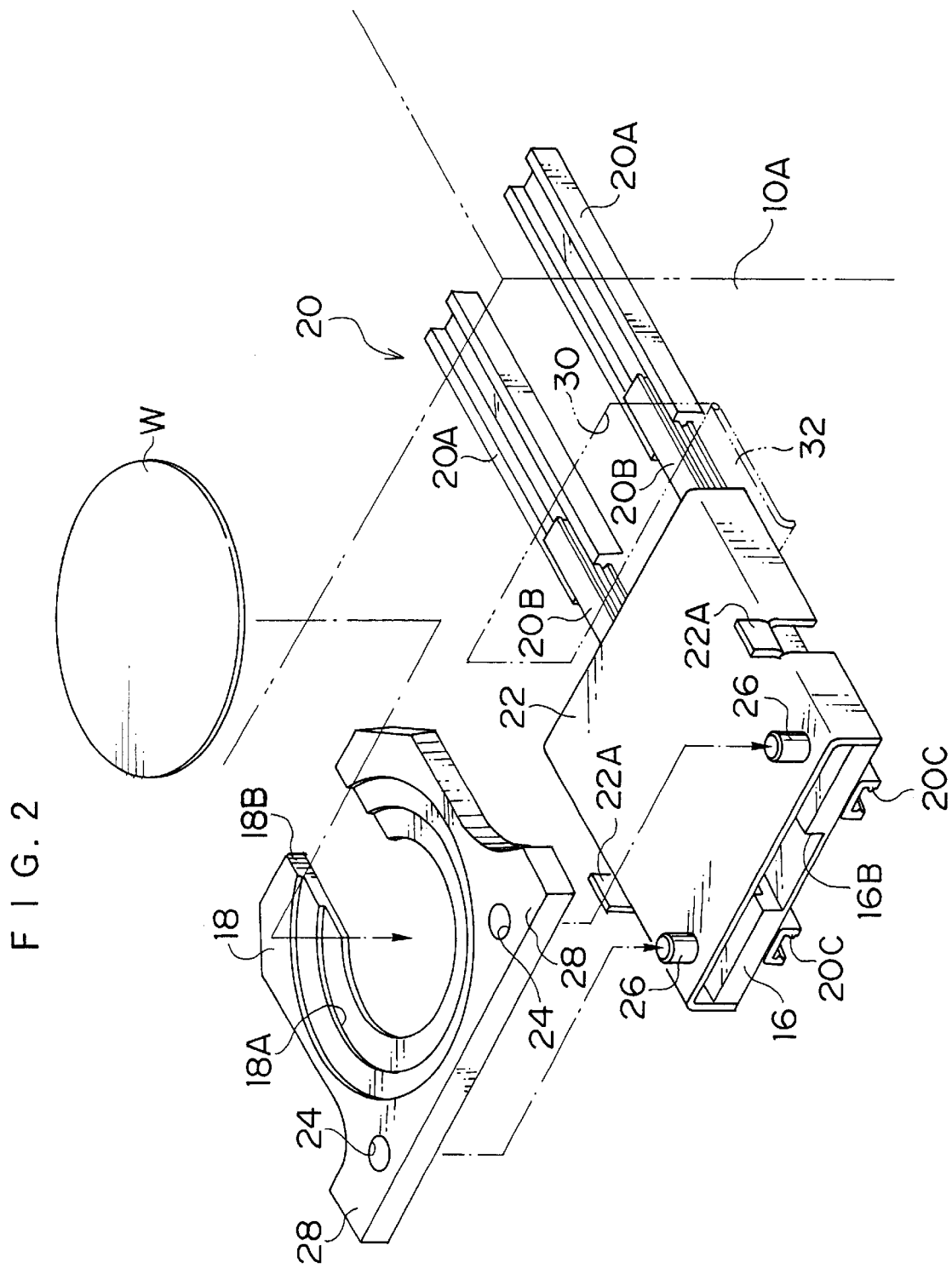
FIG. 2 is a perspective view illustrating a special tray and an inspection tray.

This invention will be described in further detail by way of example with reference to the accompanying drawings.

FIG. 1 is a perspective view illustrating a general construction of an embodiment of the wafer probing machine according to the present invention. As shown in FIG. 1, the wafer probing machine 10 comprises a housing part 12 that contains a wafer W and a probe part 14 that probes the wafer W. The wafer probing machine 10 is controlled in accordance with information input from a control panel 15.

A transport arm (not shown) is built in a body 10A and transports the wafer W between the housing part 12 and the probe part 14. The transport arm takes out the wafer W to be probed from the housing part 12 and transports it to the probe part 14. The transport arm also takes out the probed wafer W from the probe part 14 and puts it at a predetermined position in the housing part 12.

In the wafer probing machine 10, the wafer W is automatically probed in accordance with a preset program, and probe needles (not shown) are automatically cleaned. The probe needles are cleaned by means of a special cleaning wafer that is placed on a special tray 16 provided independently of the housing part 12. In order to clean the probe needles, the transport arm picks up the cleaning wafer from the special tray 16 and transports it to the probe part 14.

In order to inspect the operating state of the automatically-operated wafer probing machine 10, the operator periodically picks up the probed wafer W from the machine 10 and probes the wafer W with a probing instrument at the outside of the machine 10 (this operation will be referred to as an inspection). When the inspection is performed, the transport arm transports the wafer W for the inspection to an inspection tray 18 that is provided independently of the housing part 12. The operator picks up the wafer W, which has been placed on the inspection tray 18, from the body 10A and probes the wafer W with the probing instrument at the outside of the machine 10.

As stated previously, the inspection tray 18 must be constructed in such a manner that the operator can take out the wafer W for inspection outside the machine 10. On the other hand, the special tray 16 must be constructed in such a manner that the operator can confirm what type of cleaning wafer W is placed on the special tray 16 without retrieving the cleaning wafer W with the transport arm to the outside of the machine 10.

For the reasons stated above, the special tray 16 and the inspection tray 18 are constructed in such a way as to be horizontally drawn out as shown in FIG. 1. A description will now be given of the construction of the special tray 16 and the inspection tray 18.

Figure 3:
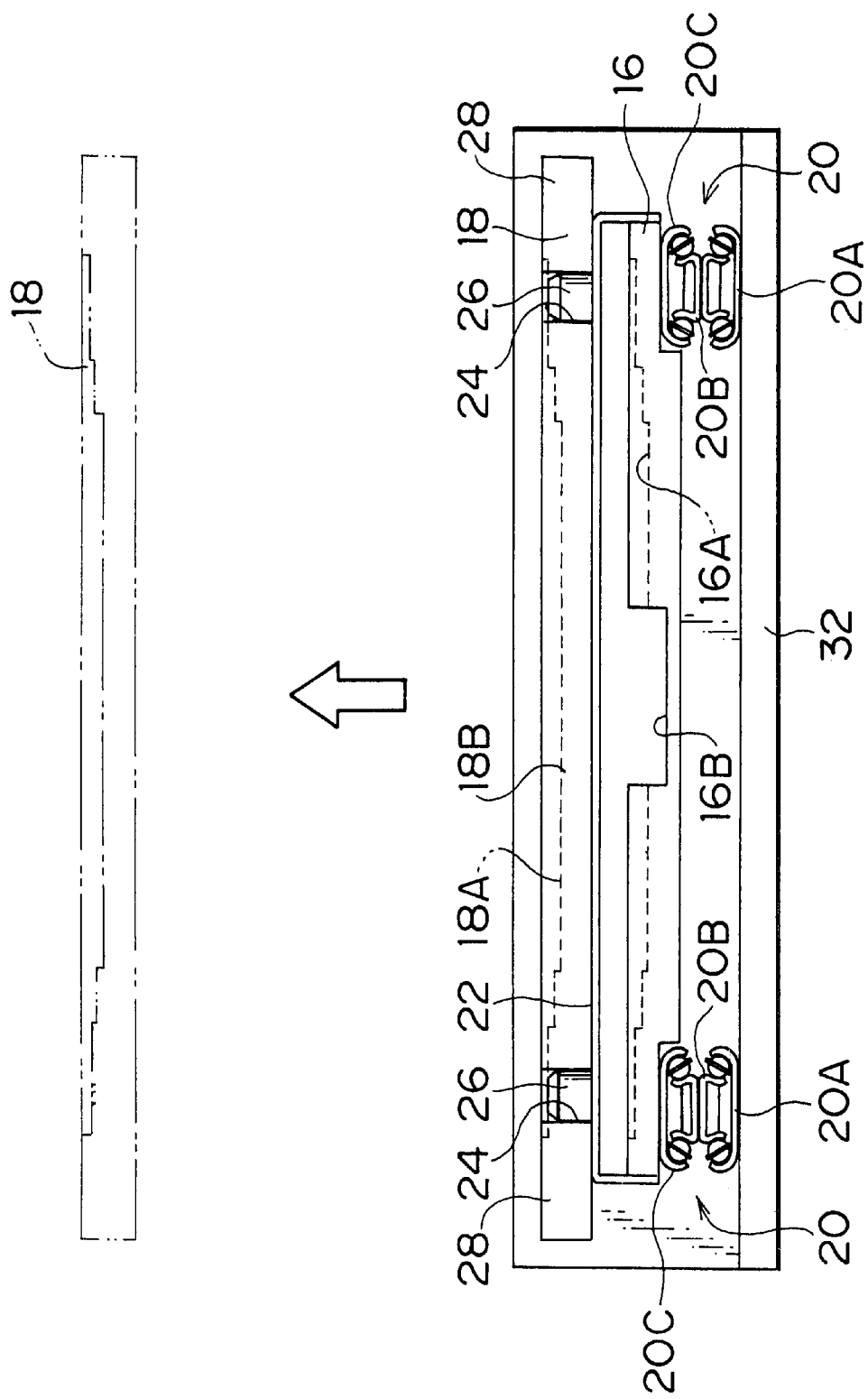
FIG. 3 is a front view of FIG. 2.
Figure 4:
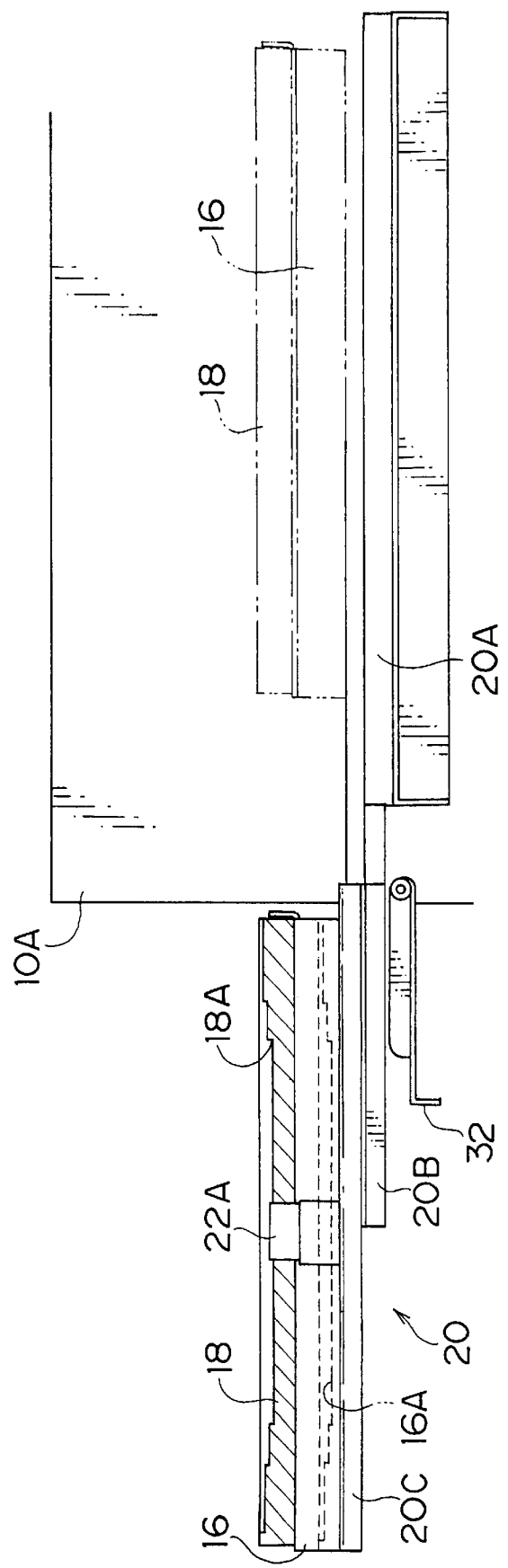
FIG. 4 is a side view of FIG. 2.

FIGS. 2, 3 and 4 are a perspective view, a front view and a side view, respectively, illustrating the construction of the special tray 16 and the inspection tray 18.

As shown in FIGS. 2 and 3, the special tray 16 is guided on a pair of slide rails 20 and can be drawn out from an opening 30, which is formed on the body 10A. The inspection tray 18 is detachably mounted on the special tray 16.

The slide rails 20 are so-called two step slide rails. Specifically, first rails 20B are slidably supported on fixed rails 20A, and second rails 20C are slidably supported on the first rails 20B. The fixed rails 20A of the slide rails 20 are horizontally fixed to a frame of the body 10A. The second rails 20C are fixed on the bottom of the special tray 16. The special tray 16 is guided on the slide rails 20 so that it can be horizontally drawn out from the body 10A.

The special tray 16 is a rectangular plate, on which a circular concave part 16A is formed in the form of steps. The wafer W that is the cleaning wafer is placed at the top of the special tray 16. The wafers of different diameters (e.g. two types in this embodiment) can be placed on the stepped concave part 16A. The wafer W is put in the step corresponding to the diameter of the wafer W.

A groove 16B is formed at the center of the special tray 16. The wafer W is picked up from the concave part 16A with a pair of vacuum tweezers inserted through the groove 16B.

A cover frame 22 is provided over the special tray 16 in a manner to cover the top of the special tray 16. The inspection tray 18 is placed on the cover frame 22.

The inspection tray 18 is formed in substantially the same manner as the special tray 16, and a concave part 18A is formed at the top of the inspection tray 18. The wafer W is placed on the concave part 18A. The inspection tray 18 is different from the special tray 16 in that a pair of reference positioning holes 24 are formed on the inspection tray 18. The reference positioning holes 24 are engaged with a pair of reference pins 26 that are provided at the top of the cover frame 22. Thereby, the inspection tray 18 can be positioned at a predetermined place on the cover frame 22. The top end of each reference pin 26 tapers off so that the reference hole 24 can be easily engaged therewith.

Flanges 28 are formed at both sides of an end of the inspection tray 18 so that the inspection tray 18 can be easily attached and detached. The operator holds the flanges 28 to attach and detach the inspection tray 18 to and from the special tray 16.

A pair of side stoppers 22A are formed at both sides of the cover frame 22. When the inspection tray 18 is placed on the cover frame 22, the side stoppers 22A are in contact with sides of the inspection tray 18. Thereby, the inspection tray 18 is prevented from shifting horizontally. The side stoppers 22A are formed by bending up parts of both sides of the cover frame 22.

In the above-mentioned construction, the special tray 16 and the inspection tray 18 can be drawn out from the body 10A through the opening 30, which is formed on the body 10A, and the inspection tray 18 can be attached to and detached from the special tray 16.

A door 32 for the opening 30 is openably attached to the body 10A. Only when the special tray 16 is drawn out, the door 32 is opened.

A description will be given of the operation of the embodiment of the wafer probing machine according to the present invention, which is constructed in the above-mentioned manner.

First, a description will be given of the inspection. To perform the inspection, the operator opens the door 32 at the opening 30 on the body 10A to draw out the special tray 16 from the body 10A.

The inspection tray 18, on which the wafer W for inspection is placed, is mounted on the special tray 16. Hence, when the special tray 16 is drawn out from the body 10A, the inspection tray 18 is drawn out together with the special tray 16.

Since the inspection tray 18, which is drawn out from the body 10A, can be detached from the special tray 16, the wafer W can be transported to the probing instrument outside the wafer probing machine 10 in the state that the wafer W is placed on the inspection tray 18.

As stated above, by transporting the wafer W together with the inspection tray 18, it is possible to prevent the wafer W from being damaged, compared with the case where the operator transports the wafer W itself by hand.

After the inspection, the wafer W is placed on the inspection tray 18 again, and the wafer W is transported together with the inspection tray 18 to the wafer probing machine 10. Then, the inspection tray 18 is mounted on the special tray 16 again, and the special tray 16 is put back into the body 10A. Then, the door 32 is closed.

As stated above, according to this embodiment, it is possible to easily and safely perform the inspection.

A description will be given of the case where the operator confirms types of cleaning wafer W placed on the special tray 16.

To find types of wafer W placed on the special tray 16 while the wafer probing machine 10 is working, the operator opens the door 32 on the opening 30 and draws out the special tray 16 from the body 10A. In this case, the inspection tray 18 is drawn out together with the special tray 16.

The operator picks up the wafer W from the drawn-out special tray 16 with a pair of vacuum tweezers, for example, and confirms types of wafer W. After the confirmation, the Wafer W is placed on the special tray 16 again, and the special tray 16 is put back into the body 10A. Then, the door 32 is closed.

As stated above, according to this embodiment, it is easy to confirm types of cleaning wafer W that is placed on the special tray 16 even while the wafer probing machine 10 is working.

In this embodiment, the inspection tray 18 is detachably mounted on the special tray 16, but it may be fixed on the special tray 16.

In this embodiment, there is provided one special tray 16 and one inspection tray 18; however, a plurality of special trays 16 may be stacked and/or a plurality of inspection trays 18 may be stacked.

Furthermore, in this embodiment, the cleaning wafer for cleaning the probe needles is placed on the special tray 16, but a correlation wafer as a correlation reference for the probe may be placed on the special tray 16.

The special tray 16 may be used as the second inspection tray as described below, although it is not detachable from the body 10A. For instance, if the wafer probing machine 10 is operated so that the only wafer with predetermined probed results (e.g. sequential fails) is placed on the second inspection tray (the special tray 16), the wafer can be easily probed with the probing instrument outside the machine. This applies to the case where a plurality of the inspection trays 18 are provided.

In this embodiment, the operator draws out the special tray 16 by hand, but the special tray 16 may be automatically pushed out by means of a rack and a pinion, etc.

As set forth hereinabove, according to the present invention, the stacked wafer trays can be drawn out from the body, and thus, the operator can confirm types of wafer placed on the wafer tray even while the machine is working.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A wafer probing machine wherein:
    a plurality of wafer trays, each of which is adapted to hold a respective wafer, are stacked enclosed within a body of the wafer probing machine and are capable of being drawn out together from said body; and
    at least one of said wafer trays is detachable from the other of said wafer trays.

2. A wafer probing machine wherein a plurality of wafer trays are stacked enclosed within a body of the wafer probing machine and are capable of being drawn out together from said body; and at least one of said wafer trays is detachable from the other of said wafer trays;

wherein a wafer for inspection is placed on one of said detachable wafer trays, and a cleaning wafer for cleaning probe needles or a correlation wafer as a correlation reference for probe is placed on others of said wafer trays.

3. A wafer probing machine comprising:

a first wafer tray enclosed within a body of the wafer probing machine and capable of being drawn out from within said body, said wafer tray being adapted to hold a first wafer; and a second wafer tray detachably mounted on said first wafer tray and capable of being drawn out with the first wafer tray from within said body, said wafer tray being adapted to hold a second wafer.

4. The wafer probing machine as defined in claim 3, wherein a wafer for inspection is placed on said second wafer tray, and a cleaning wafer for cleaning probe needles is placed on said first wafer tray.

5. The wafer probing machine as defined in claim 3, wherein a wafer for inspection is placed on said second wafer tray, and a correlation wafer as a correlation reference for probe is placed on said first wafer tray.

6. A wafer probing machine wherein:

a plurality of wafer trays are stacked enclosed within a body of the wafer probing machine and are capable of being drawn out together from said body; and at least one of said wafer trays is detachable from the other of said wafer trays;

wherein a lower one of said wafer trays is covered at top and lateral sides thereof by a cover which is open at a front side thereof; wherein positioning pins are provided on an upper side of said cover; wherein an upper one of said wafer trays is provided with reference holes through which said positioning pins are insertable for detachably mounting the upper one of said trays on the lower one of said wafer trays; and wherein guide rails are provided for displacement of the stacked wafer trays into and out of the body of the wafer probing machine.

7. A wafer probing machine comprising:

a first wafer tray enclosed within a body of the wafer probing machine and capable of being drawn out from within said body; and a second wafer tray detachably mounted on said first wafer tray and capable of being drawn out with the first wafer tray from within said body;

wherein said first wafer tray is covered at top and lateral sides thereof by a cover which is open at a front side thereof; wherein positioning pins are provided on an upper side of said cover; wherein said second wafer tray is provided with reference holes through which said positioning pins are insertable for detachably mounting the second wafer tray on the first wafer tray; and wherein guide rails are provided for displacement of the wafer trays together into and out of the body of the wafer probing machine.

\* \* \* \* \*